(12) United States Patent
Huang et al.

(10) Patent No.: US 8,703,559 B2
(45) Date of Patent: Apr. 22, 2014

(54) THIN-FILM TRANSISTOR ARRAY SUBSTRATE AND MANUFACTURING METHOD THEREOF

(75) Inventors: Hua Huang, Shenzhen (CN); Pei Jia, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 13/574,243

(22) PCT Filed: May 9, 2012

(86) PCT No.: PCT/CN2012/075250
§ 371 (c)(1),
(2), (4) Date: Jul. 19, 2012

(87) PCT Pub. No.: WO2013/159398
PCT Pub. Date: Oct. 31, 2013

(65) Prior Publication Data
US 2013/0285058 A1  Oct. 31, 2013

(30) Foreign Application Priority Data
Apr. 28, 2012  (CN) .......................... 2012 1 0132082

(51) Int. Cl.
*H01L 21/84* (2006.01)
*H01L 21/00* (2006.01)

(52) U.S. Cl.
USPC .............. 438/158; 438/151; 257/59; 257/72; 349/42; 349/43; 349/46

(58) Field of Classification Search
USPC .............. 257/59, 72; 438/151, 152, 153, 154, 438/155, 156, 157, 158, 159, 160, 161, 162, 438/163, 164, 165, 166; 349/42, 43, 44, 45, 349/46, 47, 48
See application file for complete search history.

(56) References Cited

U.S. PATENT DOCUMENTS

| | | | |
|---|---|---|---|
| 8,013,341 B2 * | 9/2011 | Jun et al. | 257/72 |
| 8,470,622 B1 * | 6/2013 | Jia | 438/30 |
| 8,486,740 B1 * | 7/2013 | Jia et al. | 438/30 |
| 2009/0108264 A1 * | 4/2009 | Inoue et al. | 257/59 |
| 2010/0163876 A1 * | 7/2010 | Inoue et al. | 257/59 |
| 2011/0049502 A1 * | 3/2011 | Jun et al. | 257/40 |

* cited by examiner

*Primary Examiner* — Matthew W Such
*Assistant Examiner* — Samuel Lair

(57) ABSTRACT

The present invention discloses a thin-film transistor (TFT) array substrate and a manufacturing method thereof. Depositing a transparent conductive layer and a first metal layer in turn on a substrate patterned by a first multi-tone mask (MTM) to form a gate, a common electrode and a reflecting layer; depositing a gate insulation layer and a semiconductor layer patterned by a second MTM to remain the semiconductor layer on the gate; and depositing a second metal layer patterned by a third MTM to form a source and a drain.

18 Claims, 3 Drawing Sheets

THIN-FILM TRANSISTOR ARRAY SUBSTRATE AND MANUFACTURING METHOD THEREOF

FIELD OF THE INVENTION

The present invention relates to the field of liquid crystal manufacturing technique, and more particularly to a thin-film transistor (TFT) array substrate and a manufacturing method thereof.

BACKGROUND OF THE INVENTION

With the constant extension and popularization of the liquid crystal display (LCD), the display performance of LCD becomes demanding. For example, a transflective LCD still can provide a clear display performance under the direct sunlight outdoors, so that it is widely applied to the field of LCD.

During the manufacturing process of the TFT array substrate of the transflective LCD, it requires a plurality of masks to execute photo-lithography processes. Especially after forming the transparency pixel electrodes, it needs an additional process to form the reflecting layer; however, the more masks, the more costs during the manufacturing process of the TFT, and it also increases the manufacturing time and complexity.

Thus, among the traditional techniques, due to the specifically additional mask to form the reflecting layer, it complicates the process of the TFT array substrate of the transflective LCD and boosts the manufacturing difficulty and costs, so that the production difficulty of the LCD is increased.

SUMMARY OF THE INVENTION

One of the objectives of the present invention is to provide a manufacturing method of a TFT array substrate to solve the traditional technique which specifically adds a mask to form a reflecting layer and thus complicates the process of the TFT array substrate of the transflective LCD and boosts the manufacturing difficulty and costs to increase the production difficulty of the LCD.

To solve the problems mentioned above, the present invention provides a method for manufacturing a TFT array substrate, wherein the method comprises the following steps of:
  providing a substrate;
  depositing a transparent conductive layer and a first metal layer in turn on the substrate, and patterning the transparent conductive layer and the first metal layer by a first multi-tone mask (MTM) to form a gate, a common electrode and a reflecting layer, wherein the gate comprises the transparent conductive layer and the first metal layer; the common electrode is formed by the transparent conductive layer; the reflecting layer is formed by the first metal layer on the common electrode; and the first MTM is a gray tone mask (GTM);
  depositing a gate insulation layer and a semiconductor layer on the substrate, and patterning the gate insulation layer and the semiconductor layer by a second MTM to remain the semiconductor layer on the gate;
  depositing a second metal layer on the substrate, wherein the second metal layer is formed by stacking a second molybdenum metal layer, a second aluminum metal layer and a third molybdenum metal layer in turn, and patterning the second metal layer by a third MTM to form a source and a drain by the second metal layer on the remained semiconductor layer.

In the method for manufacturing a TFT array substrate of the present invention, in the process of patterning the gate insulation layer and the semiconductor layer by the second MTM, the gate insulation layer on the common electrode is remained.

In the method for manufacturing a TFT array substrate of the present invention, after forming the source and the drain, the method further comprises the following step of:
  depositing a flattening layer on the gate insulation layer remained on the common electrode, and the source, drain and semiconductor layer constructing the TFT, wherein the flattening layer is formed by a transparent insulation material.

In the method for manufacturing a TFT array substrate of the present invention, in the process of patterning the gate insulation layer and the semiconductor layer by the second MTM, the gate insulation layer on the common electrode is removed by etching.

In the method for manufacturing a TFT array substrate of the present invention, after forming the source and the drain, the method further comprises the following step of:
  depositing a flattening layer on the common electrode, the reflecting layer on the common electrode, the source, drain and semiconductor layer constructing the TFT, wherein the flattening layer is formed by a transparent insulation material.

In the method for manufacturing a TFT array substrate of the present invention, each of the second MTM and the third MTM is a GTM, a stacked layer mask (SLM) or a half tone mask (HTM).

In the method for manufacturing a TFT array substrate of the present invention, the transparent conductive layer and the first metal layer are formed in turn by sputter deposition.

In the method for manufacturing a TFT array substrate of the present invention, the first metal layer is formed by combining a first aluminum metal layer and a first molybdenum metal layer in turn.

In the method for manufacturing a TFT array substrate of the present invention, in the step of patterning the transparent conductive layer and the first metal layer by the first MTM to form the gate, the common electrode and the reflecting layer, the first metal layer is wet-etched by a mixture of nitric acid, phosphoric acid and acetic acid, and the transparent conductive layer is wet-etched by oxalic acid.

Another objective of the present invention is to provide a manufacturing method of TFT array substrate to solve the traditional technique which specifically adds a mask to form a reflecting layer and thus complicates the process of the TFT array substrate of the transflective LCD and boosts the manufacturing difficulty and costs to increase the production difficulty of the LCD.

To solve the problems mentioned above, the present invention provides a method for manufacturing a TFT array substrate, wherein the method comprises the following steps of:
  providing a substrate;
  depositing a transparent conductive layer and a first metal layer in turn on the substrate, and patterning the transparent conductive layer and the first metal layer by a first MTM to form a gate, a common electrode and a reflecting layer, wherein the gate comprises the transparent conductive layer and the first metal layer; the common electrode is formed by the transparent conductive layer; and the reflecting layer is formed by the first metal layer on the common electrode;
  depositing a gate insulation layer and a semiconductor layer on the substrate, and patterning the gate insulation layer and the semiconductor layer by a second MTM to remain the semiconductor layer on the gate;

depositing a second metal layer on the substrate, and patterning the second metal layer by a third MTM to form a source and a drain by the second metal layer on the remained semiconductor layer.

In the method for manufacturing a TFT array substrate of the present invention, in the process of patterning the gate insulation layer and the semiconductor layer by the second MTM, the gate insulation layer on the common electrode is remained.

In the method for manufacturing a TFT array substrate of the present invention, after forming the source and the drain, the method further comprises the following step of:

depositing a flattening layer on the gate insulation layer remained on the common electrode, and the source, drain and semiconductor layer constructing the TFT, wherein the flattening layer is formed by a transparent insulation material.

In the method for manufacturing a TFT array substrate of the present invention, in the process of patterning the gate insulation layer and the semiconductor layer by the second MTM, the gate insulation layer on the common electrode is removed by etching.

In the method for manufacturing a TFT array substrate of the present invention, after forming the source and the drain, the method further comprises the following step of:

depositing a flattening layer on the common electrode, the reflecting layer on the common electrode, the source, drain, and semiconductor layer constructing the TFT, wherein the flattening layer is formed by a transparent insulation material.

In the method for manufacturing a TFT array substrate of the present invention, each of the second MTM and the third MTM is a GTM, a SLM or a HTM.

In the method for manufacturing a TFT array substrate of the present invention, the transparent conductive layer and the first metal layer are formed in turn by sputter deposition.

In the method for manufacturing a TFT array substrate of the present invention, the first metal layer is formed by combining a first aluminum metal layer and a first molybdenum metal layer in turn, and the second metal layer is formed by combining a second molybdenum metal layer, a second aluminum metal layer and a third molybdenum metal layer in turn.

In the method for manufacturing a TFT array substrate of the present invention, in the step of patterning the transparent conductive layer and the first metal layer by the first MTM to form the gate, the common electrode and the reflecting layer, the first metal layer is wet-etched by a mixture of nitric acid, phosphoric acid and acetic acid, and the transparent conductive layer is wet-etched by oxalic acid.

Another objective of the present invention is to provide a TFT array substrate to solve the traditional technique which specifically adds a mask to form a reflecting layer and thus complicates the process of the TFT array substrate of the transflective LCD and boosts the manufacturing difficulty and costs to increase the production difficulty of the LCD.

To solve the problems mentioned above, the present invention provides a TFT array substrate, comprising:

a substrate;

a plurality of TFTs arranged on the substrate, wherein each of the TFTs comprises a gate, a gate insulation layer, a semiconductor layer, a source and a drain; wherein the gate, the gate insulation layer, the semiconductor layer, the source and the drain are formed in turn on the substrate; the gate comprises a transparent conductive layer and a first metal layer; and the source and the drain are formed by the second metal layer on the semiconductor layer;

a common electrode formed by the transparent conductive layer on the substrate; and a reflecting layer formed by the first metal layer on the common electrode.

Comparing to the traditional technique, the present invention forms the reflecting layer by the first MTM after depositing the transparent conductive layer and the first metal layer in turn on the substrate; executes the second MTM after depositing the gate insulation layer and the semiconductor layer in turn on the substrate; and forms the TFT array substrate by the third MTM after depositing the second metal layer on the substrate. Apparently, the formation of the TFT array substrate of the transflective LCD, through three masks in the present invention, simplifies the process, reduces the manufacturing difficulty and costs, and increases the LCD yield.

For the present invention described above will be more apparent, the following specific preferred embodiment with the companying drawings will be elaborated as follows:

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Also, directional terms described by the present invention, such as upper, lower, front, back, left, right, inner, outer, side, longitudinal/vertical, transverse/horizontal, and etc., are only directions by referring to the accompanying drawings. Thus, the used directional terms are used to describe and understand the present invention, but the present invention is not limited thereto.

In the figures, the similar structural units are designated by the same reference numbers.

Figure 1:
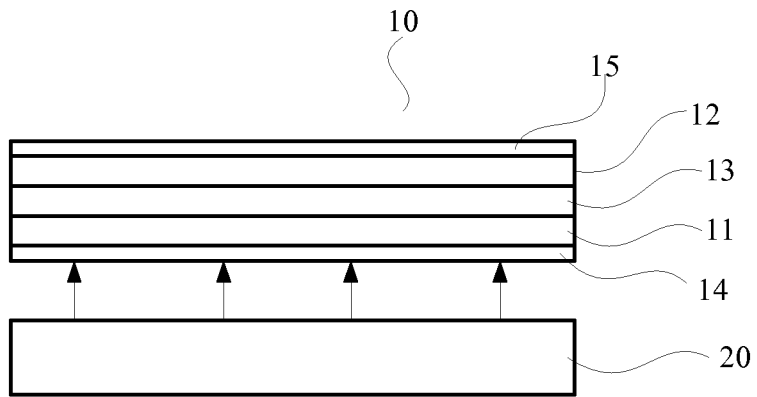
FIG. 1 is a cross-sectional schematic view of a display panel and a backlight module according to a preferred embodiment of the present invention.

Please refer to FIG. 1, a cross-sectional schematic view of a display panel and a backlight module according to a preferred embodiment of the present invention is illustrated. The method for manufacturing a TFT array substrate of this embodiment can be applied to the manufacturing process of a display panel 10 (for example, a LCD panel) to make a protective layer of a transistor. When applying the display panel 10 of this embodiment to manufacture a LCD, the display panel 10 can be arranged on a backlight module 20 so as to form the LCD. The display panel 10 can comprise a first substrate 11, a second substrate 12, a liquid crystal layer 13, a first polaroid 14 and a second polaroid 15. The material of the first substrate 11 and the second substrate 12 can be a glass substrate or a flexible plastic substrate. In this embodiment, the first substrate 11 can be for example a thin film transistor (TFT) array substrate, and the second substrate 12 can be for example a color filter (CF) substrate. It is noteworthy that in some embodiments, the CF and TFT matrix can be arranged on the same substrate as well.

As shown in FIG. 1, a liquid crystal layer 13 is formed between the first substrate 11 and the second substrate 12. The first polaroid 14 is arranged on a side of the first substrate 11 and opposite to the liquid crystal layer 13 (i.e. the incident side of the first substrate 11); the second polaroid 15 is arranged on a side of the second substrate 12 and opposite to the liquid crystal layer 13 (i.e. the emission side of the second substrate 12).

FIG. 2A-2F are flow schematic diagrams of the method for manufacturing the TFT array substrate according to the preferred embodiment of the present invention.

Figure 2A:
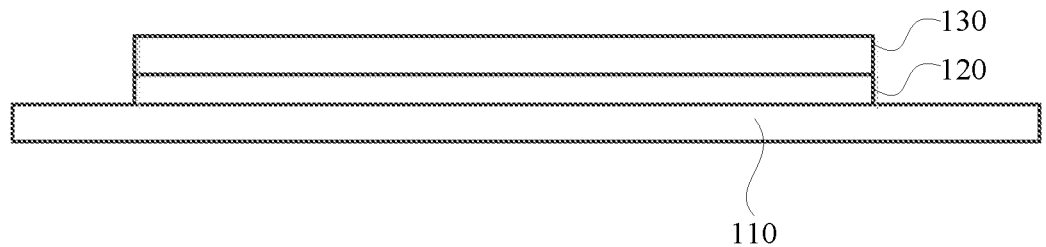
FIG. 2A-2F are flow schematic diagrams of the method for manufacturing the TFT array substrate according to the preferred embodiment of the present invention.

Please refer to FIG. 2A, a substrate 110 is provided, and a transparent conductive layer 120 and a first metal layer 130 are deposited in turn on the substrate 110.

Preferably, the transparent conductive layer 120 is formed by a transparent conductive metal such as indium tin oxide (ITO), tin oxide (TO), indium zinc oxide (IZO) or indium tin zinc oxide (ITZO).

Preferably, the first metal layer 130 is formed by combining a first aluminum metal layer and a first molybdenum metal layer in turn. Surely, it can be other materials, such as silver (Ag), copper (Cu), chromium (Cr), tungsten (W), tantalum (Ta), titanium (Ti), nitride metal or alloy combined by any above-mentioned metal, or it can also be a multi-layer structure with a heat resistant metallic film and a low resistivity film.

Figure 2B:
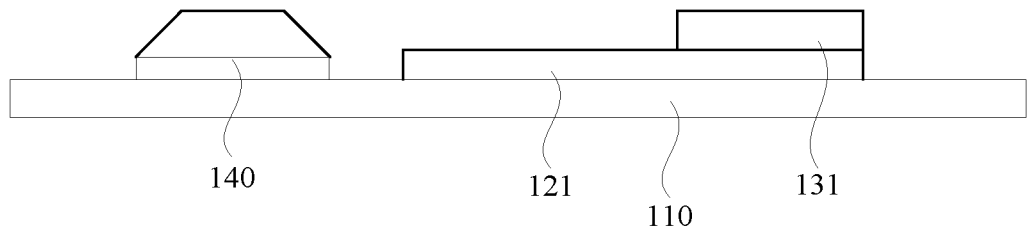

Please refer to FIG. 2B, the transparent conductive layer 120 and the first metal layer 130 as shown in FIG. 2A are patterned by a first MTM to form a gate 140, a common electrode 121 and a reflecting layer 131.

The gate 140 comprises the transparent conductive layer 120 and the first metal layer 130; the common electrode 121 is formed by the transparent conductive layer 120 on the substrate 110; and the reflecting layer 131 is formed by the first metal layer 130 on the common electrode 121.

In the specific embodiment, the transparent conductive layer 120 and the first metal layer 130 on the substrate 110 are preferably formed by sputter deposition, and then to execute the photo-lithography and etching processes by the first MTM to form the gate 140 on the transparent conductive layer 120 and the first metal layer 130. The common electrode 121 is formed by the transparent conductive layer 120 on the substrate 110, and the reflecting layer 131 is formed by the first metal 130 on the common electrode 121.

In the process of patterning the transparent conductive layer 120 and the first metal layer 130 by the first MTM to form the gate 140, the common electrode 121 and the reflecting layer, the first metal layer 130 is preferably wet-etched by a mixture of nitric acid, phosphoric acid and acetic acid, and the transparent conductive layer 120 is preferably wet-etched by oxalic acid so as to form the structure as shown in FIG. 2B. Surely, the transparent conductive layer 120 and the first metal layer 130 also can be wet-etched by other methods, but the descriptions thereof are omitted herein.

In the specific embodiment, preferably, the first MTM is a multi-tone photomask, which can be for example a GTM, a SLM or a HTM. The MTM can comprise an exposure zone, a partial exposure zone and a non-exposure zone, and form the gate 140 by the transparent conductive layer 120 and the first metal layer 130, so that the common electrode 121 is formed by the transparent conductive layer 120 on the substrate 110 and the reflecting layer 131 is simultaneously formed by the first metal layer 130 on the common electrode 121.

Figure 2C:
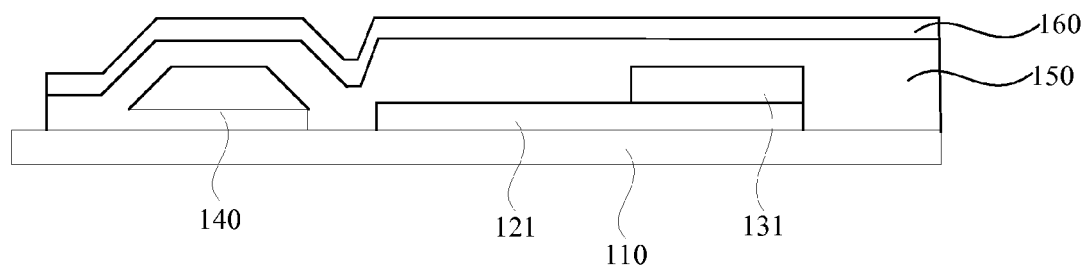

Please refer to FIG. 2C, a gate insulation layer 150 and a semiconductor layer 160 are deposited on the substrate 110.

Preferably, the present invention deposits the gate insulation layer 150 and the semiconductor layer 160 in turn by chemical vapor deposition (CVD), for example, plasma enhanced chemical vapor deposition (PECVD). Surely, the gate insulation layer 150 and the semiconductor layer 160 can be deposited by other methods, but the descriptions thereof are omitted herein.

The material of the gate insulation layer 150 can be for example silicon nitride (SiNx) or silicon oxide (SiOx) and the material of the semiconductor layer 160 is preferably poly-silicon. In this embodiment, an amorphous silicon (a-Si) layer is first deposited on the semiconductor layer 160, and then the rapid thermal annealing (RTA) step is executed to the a-Si so as to be recrystallized as a poly-silicon layer.

Figure 2D:
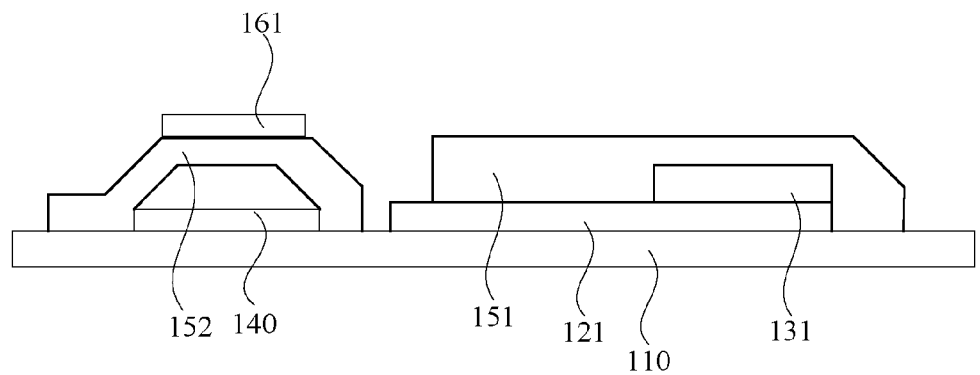

Please refer to FIG. 2D, the gate insulation layer 150 and the semiconductor layer 160 are patterned by a second MTM to remain a gate insulation layer 151 on the common electrode 121 and a semiconductor layer 161 and a gate insulation layer 152 on the gate 140.

In the step of patterning the gate insulation layer 150 and the semiconductor layer 160 by a second MTM, the semiconductor layer 160 is preferably dry-etched by reactive ion etching (RIE).

In the specific embodiment, preferably, the second MTM is a multi-tone photomask, which can be for example a GTM, a SLM or a HTM. The MTM can comprise an exposure zone, a partial exposure zone and a non-exposure zone to remain the semiconductor layer 161 and the gate insulation layer 152 on the gate 140 by remaining the gate insulation layer 151 on the common electrode 121.

Figure 2E:
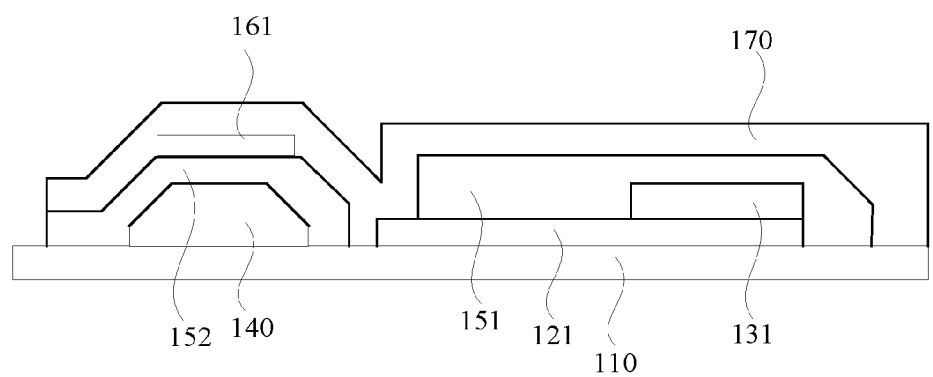

Please refer to FIG. 2E, a second metal layer 170 is deposited on the substrate 110.

In the specific embodiment, preferably, the present invention forms the second metal layer 170 by sputter deposition. Preferably, the second metal layer 170 is formed by combining the second molybdenum metal layer, the second aluminum metal layer and the third molybdenum metal layer in turn. Surely, it can be other materials such as silver (Ag), copper (Cu), chromium (Cr), tungsten (W), tantalum (Ta), titanium (Ti), nitride metal or alloy combined by any above-mentioned metal, or it can also be a multi-layer structure with a heat resistant metallic film and a low resistivity film.

Figure 2F:
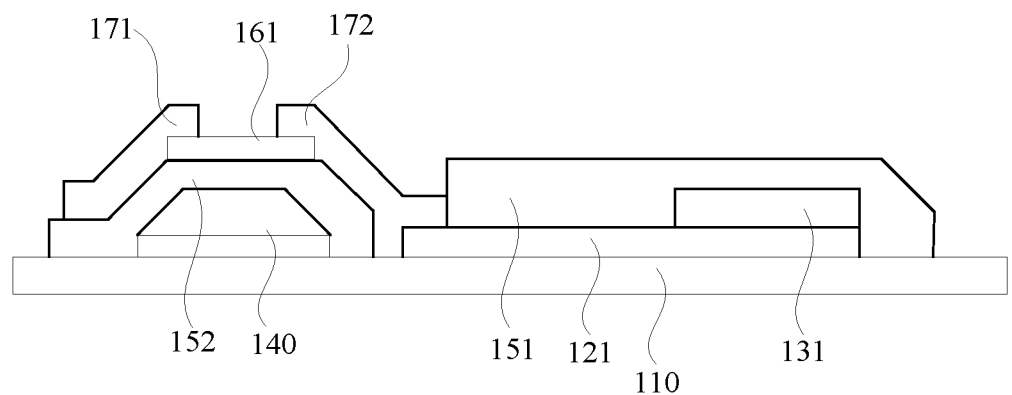

Please refer to FIG. 2F, the second metal layer 170 is patterned by the third MTM to form a source 171 and a drain 172 by the second metal layer 170 on the semiconductor layer 161.

In the process of forming the source 171 and the drain 172 by the third MTM, the second metal layer 170 is preferably wet-etched by a mixture of nitric acid, phosphoric acid and acetic acid.

In the specific embodiment, preferably, the third MTM is a multi-tone photomask, which can be for example a GTM, a SLM or a HTM. The MTM can comprise an exposure zone, a partial exposure zone and a non-exposure zone to form the source 171 and the drain 172 by the second metal layer 170 on the remained semiconductor 161.

In one embodiment, after forming the structure as shown in FIG. 2F, a flattening layer (not shown) can be deposited on the remained gate insulation layer 151, the source 171, drain 172, and semiconductor layer 161 constructing the TFT so as to achieve the effect of flattening and device protection. Preferably, the flattening layer is formed by a transparent insulation material; surely, it can be other materials as well, but the descriptions thereof are omitted herein.

Figure 2G:
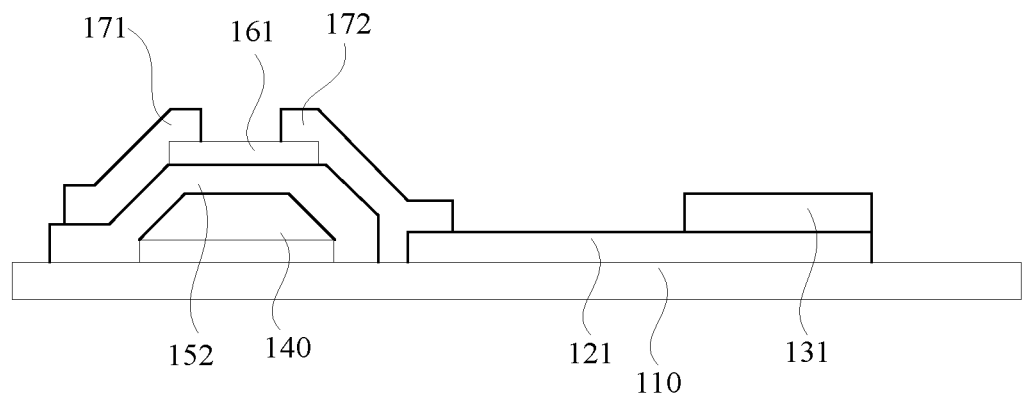
FIG. 2G is a cross-sectional schematic view of a method for manufacturing a TFT array substrate according to another preferred embodiment of the present invention.

In another embodiment, please refer to FIG. 2G, in the process of patterning the gate insulation layer 150 and the semiconductor layer 160 by the second MTM, the gate insulation layer (i.e. the gate insulation layer 151 in FIG. 2D) on the common electrode 121 is removed and only the gate insulation layer 152 on the gate 140 is remained. After forming the structure as shown in FIG. 2G, a flattening layer (not shown) can be deposited on the common electrode 121, the reflecting layer 131, the source 171, drain 172, and semiconductor 161 constructing the TFT so as to achieve the effect of flattening and device protection.

The present invention further provides a TFT array substrate comprising a substrate 110 and a common electrode 121 and a plurality of TFTs on the substrate 110.

The TFT comprises a gate 140, a gate insulation layer 152, a semiconductor 161, a source 171 and a drain 172. The gate 140, the gate insulation layer 152, the semiconductor layer 161, the source 171 and the drain 172 are formed in turn on the substrate 110; the source 171 and the drain 172 are arranged on the semiconductor layer 161; the gate 140 comprises a transparent conductive layer 120 and a first metal layer 130; and the source 171 and the drain 172 are formed by a second metal layer 170 on the semiconductor layer 161.

The TFT array substrate further comprises the common electrode 121 and a reflecting layer 131. The common electrode 121 is formed by the transparent conductive layer 120 on the substrate 110; the reflecting layer 131 is formed by the first metal layer 130 on the common electrode 121.

The method for manufacturing a TFT array substrate and a display panel of the present invention take only three masks (i.e. the first MTM, the second MTM and the third MTM) to complete the TFT array substrate of the transflective LCD without a specific additional process for forming the reflecting layer, so that it can reduce the number of the photomasks required for the process to decrease the production cost and time.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A method for manufacturing a thin-film transistor (TFT) array substrate, comprising steps of:
   providing a substrate;
   depositing a transparent conductive layer and a first metal layer in turn on the substrate, and patterning the transparent conductive layer and the first metal layer by a first multi-tone mask (MTM) to form a gate, a common electrode and a reflecting layer, wherein the gate comprises the transparent conductive layer and the first metal layer; the common electrode is formed by the transparent conductive layer; the reflecting layer is formed by the first metal layer on the common electrode; and the first MTM is a gray tone mask (GTM);
   depositing a gate insulation layer and a semiconductor layer on the substrate, and patterning the gate insulation layer and the semiconductor layer by a second MTM to remain the semiconductor layer on the gate; and
   depositing a second metal layer on the substrate, wherein the second metal layer is formed by stacking a second molybdenum metal layer, a second aluminum metal layer and a third molybdenum metal layer in turn, and patterning the second metal layer by a third MTM to form a source and a drain by the second metal layer on the remained semiconductor layer.

2. The method for manufacturing a TFT array substrate according to claim 1, wherein in the process of patterning the gate insulation layer and the semiconductor layer by the second MTM, the gate insulation layer on the common electrode is remained.

3. The method for manufacturing a TFT array substrate according to claim 2, wherein after forming the source and the drain, the method further comprises the following step of:
   depositing a flattening layer on the gate insulation layer remained on the common electrode, and the source, drain and semiconductor layer constructing the TFT, wherein the flattening layer is formed by a transparent insulation material.

4. The method for manufacturing a TFT array substrate according to claim 1, wherein in the process of patterning the gate insulation layer and the semiconductor layer by the second MTM, the gate insulation layer on the common electrode is removed by etching.

5. The method for manufacturing a TFT array substrate according to claim 4, wherein after forming the source and the drain, the method further comprises the following step of:
   depositing a flattening layer on the common electrode, the reflecting layer on the common electrode, the source, drain and semiconductor layer constructing the TFT, wherein the flattening layer is formed by a transparent insulation material.

6. The method for manufacturing a TFT array substrate according to claim 1, wherein each of the second MTM and the third MTM is a GTM, a stacked layer mask (SLM) or a half tone mask (HTM).

7. The method for manufacturing a TFT array substrate according to claim 1, wherein the transparent conductive layer and the first metal layer are formed in turn by sputter deposition.

8. The method for manufacturing a TFT array substrate according to claim 1, wherein the first metal layer is formed by combining a first aluminum metal layer and a first molybdenum metal layer in turn.

9. The method for manufacturing a TFT array substrate according to claim 1, wherein in the process of patterning the transparent conductive layer and the first metal layer by the first MTM to form the gate, the common electrode and the reflecting layer, the first metal layer is wet-etched by a mixture of nitric acid, phosphoric acid and acetic acid, and the transparent conductive layer is wet-etched by oxalic acid.

10. A method for manufacturing a TFT array substrate, comprising steps of:
    providing a substrate;
    depositing a transparent conductive layer and a first metal layer in turn on the substrate, and patterning the transparent conductive layer and the first metal layer by a first MTM to form a gate, a common electrode and a reflecting layer, wherein the gate comprises the transparent conductive layer and the first metal layer; the common electrode is formed by the transparent conductive layer; and the reflecting layer is formed by the first metal layer on the common electrode;
    depositing a gate insulation layer and a semiconductor layer on the substrate, and patterning the gate insulation layer and the semiconductor layer by a second MTM to remain the semiconductor layer on the gate; and
    depositing a second metal layer on the substrate, and patterning the second metal layer by a third MTM to form a source and a drain by the second metal layer on the remained semiconductor layer.

11. The method for manufacturing a TFT array substrate according to claim 10, wherein in the process of patterning the gate insulation layer and the semiconductor layer by the second MTM, the gate insulation layer on the common electrode is remained.

12. The method for manufacturing a TFT array substrate according to claim 11, wherein after forming the source and the drain, the method further comprises the following step of:
   depositing a flattening layer on the gate insulation layer remained on the common electrode, and the source, drain and semiconductor layer constructing the TFT, wherein the flattening layer is formed by a transparent insulation material.

13. The method for manufacturing a TFT array substrate according to claim 10, wherein in the process of patterning the gate insulation layer and the semiconductor layer by the second MTM, the gate insulation layer on the common electrode is removed by etching.

14. The method for manufacturing a TFT array substrate according to claim 13, wherein after forming the source and the drain, the method further comprises the following step of:
   depositing a flattening layer on the common electrode, the reflecting layer on the common electrode, the source, drain and semiconductor layer constructing the TFT, wherein the flattening layer is formed by a transparent insulation material.

15. The method for manufacturing a TFT array substrate according to claim 10, wherein each of the second MTM and the third MTM is a GTM, a SLM or a HTM.

16. The method for manufacturing a TFT array substrate according to claim 10, wherein the transparent conductive layer and the first metal layer are formed in turn by sputter deposition.

17. The method for manufacturing a TFT array substrate according to claim 10, wherein the first metal layer is formed by combining a first aluminum metal layer and a first molybdenum metal layer in turn, and the second metal layer is formed by combining a second molybdenum metal layer, a second aluminum metal layer and a third molybdenum metal layer in turn.

18. The method for manufacturing a TFT array substrate according to claim 10, wherein in the process of patterning the transparent conductive layer and the first metal layer by the first MTM to form the gate, the common electrode and the reflecting layer, the first metal layer is wet-etched by a mixture of nitric acid, phosphoric acid and acetic acid, and the transparent conductive layer is wet-etched by oxalic acid.

* * * * *